United States Patent [19]
Hedstrom et al.

[11] Patent Number: 5,272,448
[45] Date of Patent: Dec. 21, 1993

[54] METHOD AND APPARATUS TO PERFORM DIGITAL DEMODULATION BY MEASURING PERIODS BETWEEN ZERO CROSSINGS

[75] Inventors: Mark D. Hedstrom, Naples; Robert B. Porter, Bonita Springs; Charles R. Crego, Fort Myers, all of Fla.

[73] Assignee: NUMA Technologies, Inc., Naples, Fla.

[21] Appl. No.: 875,848

[22] Filed: Apr. 29, 1992

Related U.S. Application Data

[63] Continuation-in-part of Ser. No. 794,150, Nov. 20, 1991, Pat. No. 5,159,281.

[51] Int. Cl.$^5$ .............................................. H03D 3/00
[52] U.S. Cl. ........................................ 329/312; 329/321; 329/341; 375/80; 375/95
[58] Field of Search .............. 329/300, 301, 303–305, 329/310–314, 321, 327, 329, 335, 340–343, 345; 455/214, 337; 375/80, 82, 94–96

[56] References Cited

U.S. PATENT DOCUMENTS

| | | | |
|---|---|---|---|
| 4,412,339 | 10/1983 | Alfke et al. | 375/95 |
| 4,570,126 | 2/1986 | Demmer et al | 329/107 |
| 4,596,022 | 6/1986 | Stoner | 329/303 |
| 4,707,666 | 11/1987 | Pfeifer et al. | 329/343 |
| 4,992,748 | 2/1991 | Gard | 329/321 |
| 5,159,281 | 10/1992 | Hedstrom et al | 329/312 |

OTHER PUBLICATIONS

Thomas, D. M., "Heath's Digital FM Tuner", Radio-Electronics, May, 1973, pp. 42–45, 50, 98.
Krauss, H. L., Bostian, C. W., and Raab, F. H., Solid State Radio Engineering, pub. by John Wiley & Sons, 1980, pp. 254–255, 315–317.
R. J. Higgins, Digital Signal Processing in VLSI, publ., by Prentice-Hall, 1990, (FIG. 5.6) and p. 268.
Bendat, J. S. and Piersol, A. G., Random Data: Analysis and Measurement Procedures, 2nd Ed., publ. by Wiley, 1986, p. 340.
Oppenheim, A. V., and Schafter, R. W., Digital Signal Processing, publ. by Prentice-Hall, 1975, pp. 242, 408–409.
D. K. Leimer, "All-Digital FM Demodulation Using IF Zero-Crossings", Magnavox Advanced Products and Systems Company, IEEE, 1982, pp. D3.3.1–D3.3.5. (Feb. 82).
C. R. Cahn et al., "Digital Phase Sampling for Microcomputer Implementation of Carrier Acquisition and Coherent Tracking", IEEE Transactions on Communication, vol. Com-28, No. 8, Aug., 1980, pp. 1190–1196.

Primary Examiner—Siegfried H. Grimm
Attorney, Agent, or Firm—Weingarten, Schurgin, Gagnebin & Hayes

[57] ABSTRACT

A digital demodulator provides efficient demodulation of frequency modulated, pulse-width modulated, and other temporally modulated signals. Without employing an analog-to-digital converter, modulating signal information is extracted from a modulated signal as numerical information. For frequency demodulation, a high gain stage is applied to an incoming FM signal to produce a corresponding sequence of square waves. The period between zero-crossings of the square waves is accurately measured to within one clock pulse using a high-speed clock and at least one counter to produce a demodulated signal.

7 Claims, 2 Drawing Sheets

METHOD AND APPARATUS TO PERFORM DIGITAL DEMODULATION BY MEASURING PERIODS BETWEEN ZERO CROSSINGS

CROSS-REFERENCE TO RELATED APPLICATION

This application is a continuation-in-part of application Ser. No. 07/794,150, filed Nov. 20, 1991 now Pat. No. 5,159,281.

FIELD OF THE INVENTION

This invention relates to a method and apparatus for detecting and demodulating signals with temporally modulated features, and particularly to frequency modulated signals.

BACKGROUND OF THE INVENTION

In Frequency Modulation (FM), a sinusoidal carrier signal of constant amplitude and frequency is modulated by an input signal of a lower frequency and of varying amplitude. FM thereby produces an output signal that is constant in amplitude, varying in frequency in accordance with the input signal, and within a specified frequency range called the deviation bandwidth. In particular, the instantaneous amplitude of the input signal is linearly transformed into a change $d\omega$ in the instantaneous frequency $\omega(t)$ of the carrier frequency $\omega_c$. To recover the input modulating signal from the output modulation signal, frequency demodulation must be performed using an FM demodulator.

FM demodulators are well known, and consist of devices such as ratio detectors, Foster Seeley discriminators, phase-locked loop detectors, pulse-counting detectors, and quadrature or coincidence detectors. All of these demodulators—whether implemented as analog or digital apparatus—pass data to post-processing stages, and ultimately to an output amplifier.

For example, the Heathkit AJ-1510 Digital FM Tuner employs a digital discrimination technique for demodulating a frequency modulated signal. The discriminator is of the pulse position modulation type, is inductorless and diodeless, and contains two integrated circuits: a retriggerable monostable multivibrator, and an operational amplifier. An input signal at the retriggerable monostable multivibrator causes it to change states for a fixed period of time, as determined by an RC network to provide a sequence of pulses of constant width and amplitude that are generated at about one-half of the IF rate. Each pulse represents a zero-crossing event. Signal information is represented as deviations in the frequency of the zero-crossing pulses from a constant IF frequency.

In a pulse integration type of FM demodulator, the frequency modulated signals typically are amplified and "hard-limited" to produce square waves which have zero-crossings spaced in the same manner as the zero-crossings of the FM signals. The square waves are then converted into a sequence of constant width and amplitude pulses, one pulse for each zero-crossing of the modulated input signal. Each pulse is integrated (or filtered) and subsequently differentiated to reproduce the modulating input signal information.

There are pulse integration demodulators that employ single one-shot multivibrator that is triggered at each zero-crossing. However, recovery time difficulties are encountered during high frequency operation because the internal delay of the multivibrator approaches the period of the high frequency signals as the operating frequency is increased.

In another form of pulse integration demodulator, a source of frequency modulated signals is coupled to a coincidence detector by a first and second signal path. The first and second signal paths have unequal signal delay characteristics, so that the coincidence detector provides an output signal that includes a series of constant width pulses, wherein pulse width is determined by a difference in signal delay between the first and second signal paths. A low pass filter is coupled to the coincidence detector to recover the signal modulation represented by the series of constant width pulses. However, this form of pulse integrator exhibits operating disadvantages due to non-linearity of th integrating network which impairs its ability to perform sufficiently precise integration on the applied signal pulse train.

SUMMARY OF THE INVENTION

An apparatus and method is provided for demodulating a frequency modulated (FM), pulse-width modulated (PWM), or other temporally modulated signal. Without employing an analog-to-digital converter, modulating signal information is extracted from a modulated signal as numerical information. To demodulate an FM signal, for example, a high gain stage is applied to an incoming FM signal to produce a corresponding sequence of square waves. The period between zero-crossings of the square waves is precisely measured and represented numerically using a high-speed clock and at least one counter to produce a demodulated signal.

After a received FM signal is heterodyned with a local oscillator signal, the resulting FM intermediate frequency (IF) signal is "hard-limited" to yield a hard-limited FM IF signal that substantially resembles a sequence of square waves which are provided to a sign detector for detecting zero-crossings. In preferred embodiments, the frequency of the local oscillator signal is chosen so as to yield relatively low FM IF frequencies. The sign detector is coupled to a pair of gating circuits, each gating circuit being coupled to a respective pulse counter, and to a clock. The gating circuits are alternately enabled in accordance with the instantaneous sign of the hard limited FM IF signal. When enabled, each sample gating circuit provides a sequence of clock pulses from the clock to a respective pulse counter. Each pulse counter stores a respective count value that represents the period between zero-crossings of the hard-limited FM IF signal. The foregoing elements together constitute a digital discriminator. Increasing the rate of the clock yields improved resolution in the reconstructed modulating signal, up to the maximum resolution of the counting circuit.

The digital demodulator of the invention exploits the linearity of digital processing to provide excellent performance. Since the demodulation method of the invention requires only low level signals (approximately 75 db $\mu v$) and introduces minimal noise, lower total noise levels result, and a high signal-to-noise ratio is achieved. Consequently, the demodulator of the invention can more easily receive weak signals, and suffers fewer "drop-outs", a problem that is now common in fringe reception areas, as well as in dense urban centers. Also, the invention reduces the need for amplification of a received signal, thereby increasing reliability and reception quality. Therefore, at a given level of transmission power, greater transmission range is possible. One potential product area is in satellite broadcast applications; a smaller antenna could be used when the method of the invention is employed within the receiver. Further, the invention can be practiced using currently available, relatively inexpensive components. Also, since it is consistent and cooperative with existing modulation standards and transmission formats, the invention actually increases the value of the currently installed base of transmission equipment. Although the invention provides benefits when included in 2-way radio, cellular telephone, and FM broadcast applications, the invention is not limited to a specific frequency band, or to a particular application.

DESCRIPTION OF THE DRAWING

The invention will be more fully understood from the following detailed description, in conjunction with the accompanying figures, in which.

DESCRIPTION OF THE PREFERRED EMBODIMENT

Figure 1:
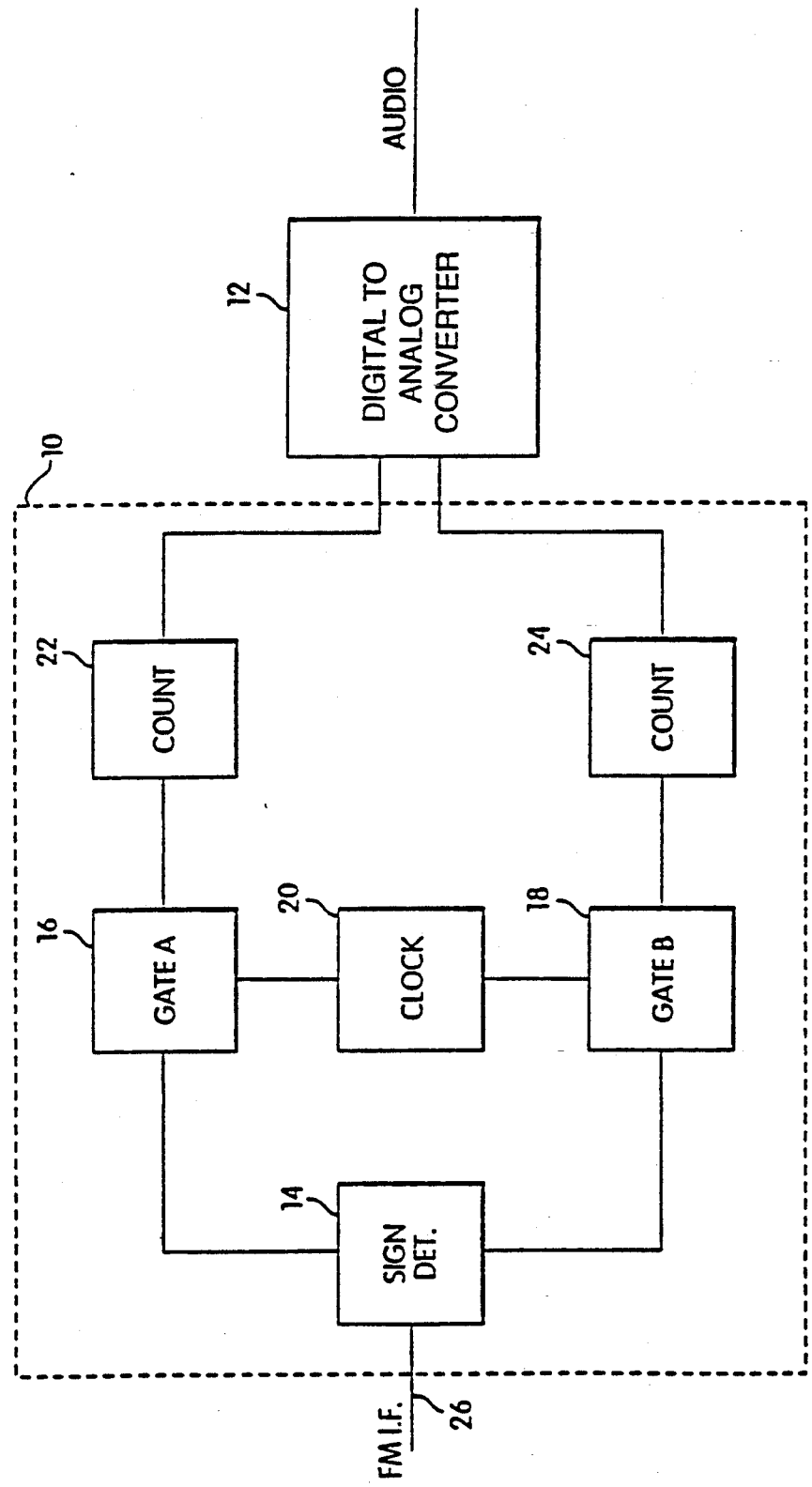
FIG. 1 is a block diagram of a digital discriminator cooperative with a digital-to-analog converter (DAC)

With reference to FIG. 1, a digital discriminator 10 is shown in cooperation with a digital-to-analog converter (DAC) 12. The digital discriminator 10 utilizes zero-crossing detection and period measurement of a "hard-limited" FM IF signal to recover an associated modulating signal by exploiting the fact that the instantaneous frequency of an FM IF signal is inversely proportional to the instantaneous period of the associated modulating signal.

Discrimination is accomplished by applying a "hard-limited" FM IF signal to the sign detector 14. To form a hard-limited signal, an input signal is amplified and then clipped to provide what is essentially a square wave. The sign detector 14 ascertains the instantaneous polarity along each corresponding half-cycle of the FM IF signal, thereby defining the moment of each zero-crossing. The period between zero-crossings is determined by providing information regarding the moment of each zero-crossing to gating circuits 16 and 18. The gating circuits 16 and 18 are alternately enabled or disabled in accordance with the instantaneous sign of the hard-limited FM IF signal provided by the sign detector 14. When enabled, each sample gating circuit provides a sequence of clock pulses from the clock 20 to a respective pulse counter 22 or 24 until the other sample gating circuit 18 or 16 is enabled. A short sequence of clock pulses between zero-crossings corresponds to a large modulating signal amplitude, while a long sequence of system clock pulses corresponds to a small modulating signal amplitude. Each sequence of clock pulses is integrated by a respective counter 22 or 24 to provide a count value that represents the period of a half cycle of the FM IF signal. The counters 22 and 24 alternately provide count values to the DAC 12.

Figure 2:
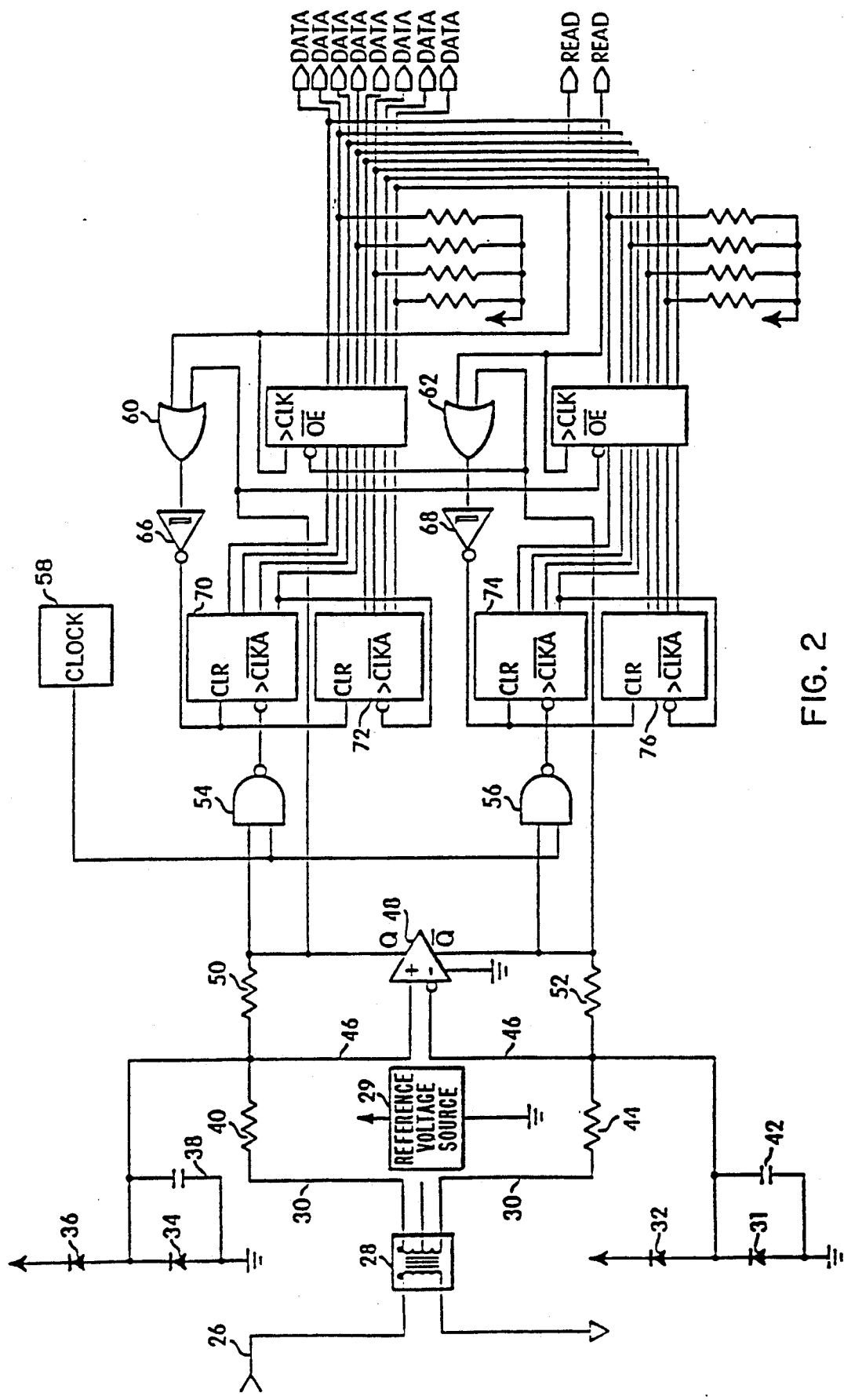
FIG. 2 is a schematic diagram of the digital discriminator of FIG. 1.

Referring to FIG. 2, a preferred embodiment of the discriminator 10 of FIG. 1 will now be discussed. A hard limited IF FM signal 26 is applied to the primary winding of transformer 28. This transformer stage provides the required impedance matching to the preceding circuit stages and dc decoupling or blocking to the succeeding stage. The center tap of the secondary of transformer 28 is biased by a reference voltage source 29 at the mid-point of the circuit supply voltage to provide a DC reference voltage. The reference voltage source 29 establishes a voltage level about which the oppositely phased voltages developed across the secondary winding of transformer 28 are symmetrical. These oppositely phased voltages represent zero-axis crossings corresponding to the zero-crossings of the modulated IF FM signal. The signal 30 from the transformer 28 is limited in amplitude by small signal diodes 31–36, and is low pass filtered by resistor and capacitor pairs 38, 40 and 42, 44. This limited and filtered signal 46 is applied in a differential manner to the inverting and non-inverting inputs of comparator 48. Switching hysteresis is provided by applying positive feedback from both Q and $\overline{Q}$ outputs via resistors 50 and 52, respectively. The comparator outputs Q and $\overline{Q}$ produce gate pulses proportional in width to the zero crossings of the FM IF signal. This gate pulse is applied to one of the inputs on each of the NAND gates 54 and 56. Clock 58 provides a source of high frequency clock pulses which is similarly applied to the other inputs of NAND gates 54 and 56. The resultant output of NAND gates 54 and 56 contain multiple sample clock periods wherein the number of sample clock periods are directly proportional to the width of the gating pulse. Comparator 48 outputs Q and $\overline{Q}$ are applied to one input of OR gate 60 and 62 to be combinatorially or'd with the $\overline{READ}$ signal to provide a $\overline{CLR} = \overline{Q} * \overline{READ}$ function which is subsequently fed to inverter gates 66 and 68 for signal inversion and is then applied to the clear inputs of counters 70 and 72, and counters 74 and 76. The counter clear operation occurs during the READ operation for each counter 70–76 on each alternating half cycle of the gate pulses produced at Q and $\overline{Q}$ of comparator 48. The UP counters 70–76 count clock transitions applied to the clock input o the first 4-bit counter stage during a positive or high level at either Q or $\overline{Q}$0 of comparator 48. Each counter 70–76 alternately counts during each half cycle of the FM signal. Each counter is then cleared during the opposite counters "UP" count period. The count information of each counter is latched into the corresponding 8-bit latch on the rising edge of the alternate counters "gate pulse" Q and $\overline{Q}$. This allows the data to be latched before the information is lceared from the counter during the next valid clear signal. Period information in the form of "count values" are subsequently read from each counter on an alternating basis. Data is available to the data bus during a valid $\overline{READ}$ signal from the numerical processor.

Given the incoming binary pulse-count data provided by the counters 22 and 24, the system provides complete demodulation of an FM IF signal, in the sense that a voltage proportional and commensurate with the binary pulse-count data is output to the DAC 12.

Low-pass filtering can then be used to reduce inband noise, and smooth out residual quantization jitter. The filters used include, but are not limited to, direct form (DF), finite impulse response (FIR), and infinite impulse response (IIR) filter realizations. The direct form filter, for example, has the following form, $$A(x) = \sum_{k=1}^{J} a_k A(x-k) + \sum_{k=0}^{L} b_k N(x-k) \quad (16)$$

where, A(x), the filter output, is the result of the recursion step where previous outputs, A(x−k), are convolved with IIR coefficients $a_k$, and previous inputs are convolved with FIR coefficients $b_k$.

For example, a low order (e.g. 5-10 zeros and poles) IIR Buterworth filter can e applied to a signal template, in real time, just prior to signal output to the DAC stage 12. A Butterworth filtering technique was chosen due to its exceptionally flat passband response, and approaches a true "brick-wal" type filter in its digital realization.

Additionally, it may be desirable to weight and scale the count values prior to filtering, and such weighting and scaling can be adequately performed using simple angloy circuitry, as is well-known in the art.

Other modifications and implementations will occur to those skilled in the art without departing from the spirit and the scope of the invention as claimed. Accordingly, the above description is not intended to limit the invention except as indicated in the following claims.

What is claimed is:

1. A digital demodulator for efficient demodulation of temporally modulated signals the demodulator comprising:
    a zero-crossing event detector, responsive to a temporally modulated signal, that serves to detect zero-crossing events of said temporally modulated signal, and thereby provide zero-crossing event information;
    a period measurer, connected to said zero-crossing detector, that serves to receive said zero-crossing event information and measure the period between said zero-crossing events, thereby providing a sequence of period measurement values that represents a demodulated signal; and a digital-to-analog converter that receives said sequence of period measurement values and provides an analog form of said demodulated signal.

2. The digital demodulator of claim 1 wherein said zero-crossing detector provides zero-crossing event information as a sequence of square waves with zero-crossings commensurate with the zero-crossings of said temporally modulated signal.

3. A digital demodulator comprising:
    a zero-crossing event detector, responsive to a temporally modulated signal, that serves to detect zero-crossing events of said temporally modulated signal, and thereby provide zero-crossing event information;
    a period measurer, connected to said zero-crossing detector, that serves to receive said zero-crossing event information and measure the period between said zero-crossing events, thereby providing a sequence of period measurement values that represents a demodulated signal
    wherein said period measurer includes:
        a clock;
        a counter; and
        a clock pulse gate, connected to said clock, said counter, and said zero-crossing detector, that permits clock pulses to propagate from said clock to said counter in response to zero-crossing event information provided by said zero-crossing detector.

4. The digital demodulator of claim 3 further comprising:
    a second clock pulse gate, connected to said clock and said zero-crossing detector; and
    a second counter, connected to said second clock pulse gate.

5. A method for demodulating a temporally modulated signal, the method comprising the steps of:
    measuring the period between zero-crossings of an intermediate signal of a modulated signal to provide a sequence of period values that represent a demodulated signal amplitude.

6. A digital demodulator for demodulation of temporally modulated signals comprising:
    a zero-crossing detector;
    a clock;
    a first counter;
    a first clock pulse gate, coupled to said clock, said first counter, and said zero-crossing detector, wherein said first clock pulse gate permits clock pulse signals to propagate from said clock to said first counter in response to a first signal provided by said zero-crossing detector;
    a second counter; and
    a second clock pulse gate, coupled to said clock, said zero-crossing detector and said second counter, wherein said second cock pulse gate permits clock pulse signals to propagate from said clock to said second counter in response to a second signal provided by said zero-crossing detector.

7. The digital demodulator of claim 6 wherein the zero-crossing detector includes a transformer having a primary winding adapted to receive an input signal, and having a secondary winding with a center tap; and
    a reference voltage source coupled to the center tap of the transformer secondary winding, wherein the reference voltage source provides a reference voltage level about which oppositely phased voltages developed across the transformer secondary winding are symmetrical.

* * * * *

UNITED STATES PATENT AND TRADEMARK OFFICE
CERTIFICATE OF CORRECTION

PATENT NO. : 5,272,448
DATED : December 21, 1993
INVENTOR(S) : Mark D. Hedstrom, et al.

It is certified that error appears in the above-indentified patent and that said Letters Patent is hereby corrected as shown below:

Column 4, line 27, "gate 60" should read --gates 60--.

Column 4, line 38, "$\overline{Q}O$ of" should read --$\overline{Q}$ of--.

Column 4, line 46, "lceared" should read --cleared--.

Column 5, line 4, "can e" should read --can be--.

Signed and Sealed this

Seventh Day of March, 1995

Attest:

BRUCE LEHMAN

*Attesting Officer*   *Commissioner of Patents and Trademarks*